United States Patent
Ebeling

(10) Patent No.: US 6,434,179 B1
(45) Date of Patent: Aug. 13, 2002

(54) SEMICONDUCTOR LASER CHIP

(75) Inventor: Karl Joachim Ebeling, Ulm (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/601,128

(22) PCT Filed: Jan. 29, 1999

(86) PCT No.: PCT/DE99/00240

§ 371 (c)(1),
(2), (4) Date: Sep. 19, 2000

(87) PCT Pub. No.: WO99/39405

PCT Pub. Date: Aug. 5, 1999

(30) Foreign Application Priority Data

Jan. 30, 1998 (DE) .......................... 198 03 759

(51) Int. Cl.$^7$ ............................. H01S 5/32; H01S 5/183
(52) U.S. Cl. ............................. 372/45; 372/96
(58) Field of Search ..................... 372/45, 96

(56) References Cited

U.S. PATENT DOCUMENTS

| | | | |
|---|---|---|---|
| 5,016,252 A | 5/1991 | Hamada et al. | 372/45 |
| 5,252,839 A | 10/1993 | Fouquet | 257/13 |
| 5,636,234 A | 6/1997 | Takagi | 372/43 |
| 5,781,575 A * | 7/1998 | Nilsson | 372/50 |

FOREIGN PATENT DOCUMENTS

| | | |
|---|---|---|
| EP | 0 076 761 | 4/1983 |
| EP | 0 663 710 A2 | 7/1995 |
| JP | 247084 | 11/1986 |
| JP | 2 71574 | 3/1990 |

* cited by examiner

Primary Examiner—James W. Davie
(74) Attorney, Agent, or Firm—Schiff Hardin & Waite

(57) ABSTRACT

Semiconductor laser chip, whereby a laser-active semiconductor structure is arranged in an optical resonator. Two or more series-connected, laser-active pn-junctions whose forward directions are isodirected are introduced into one and the same resonator of the semiconductor laser chip. A respective pn-junction whose forward direction is opposite the forward direction of the laser-active pn-junctions is arranged between two laser-active pn-junctions.

2 Claims, 4 Drawing Sheets

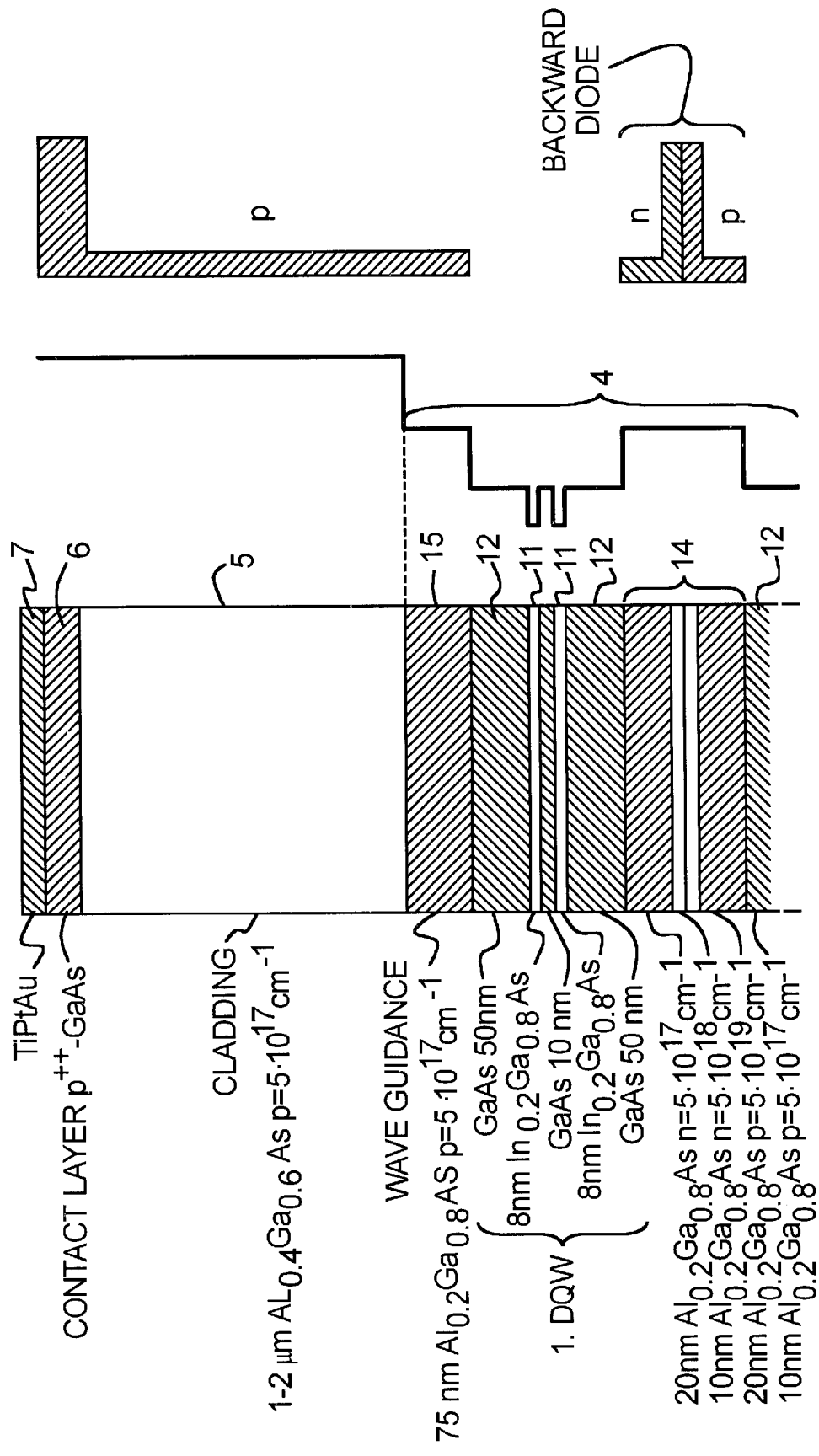

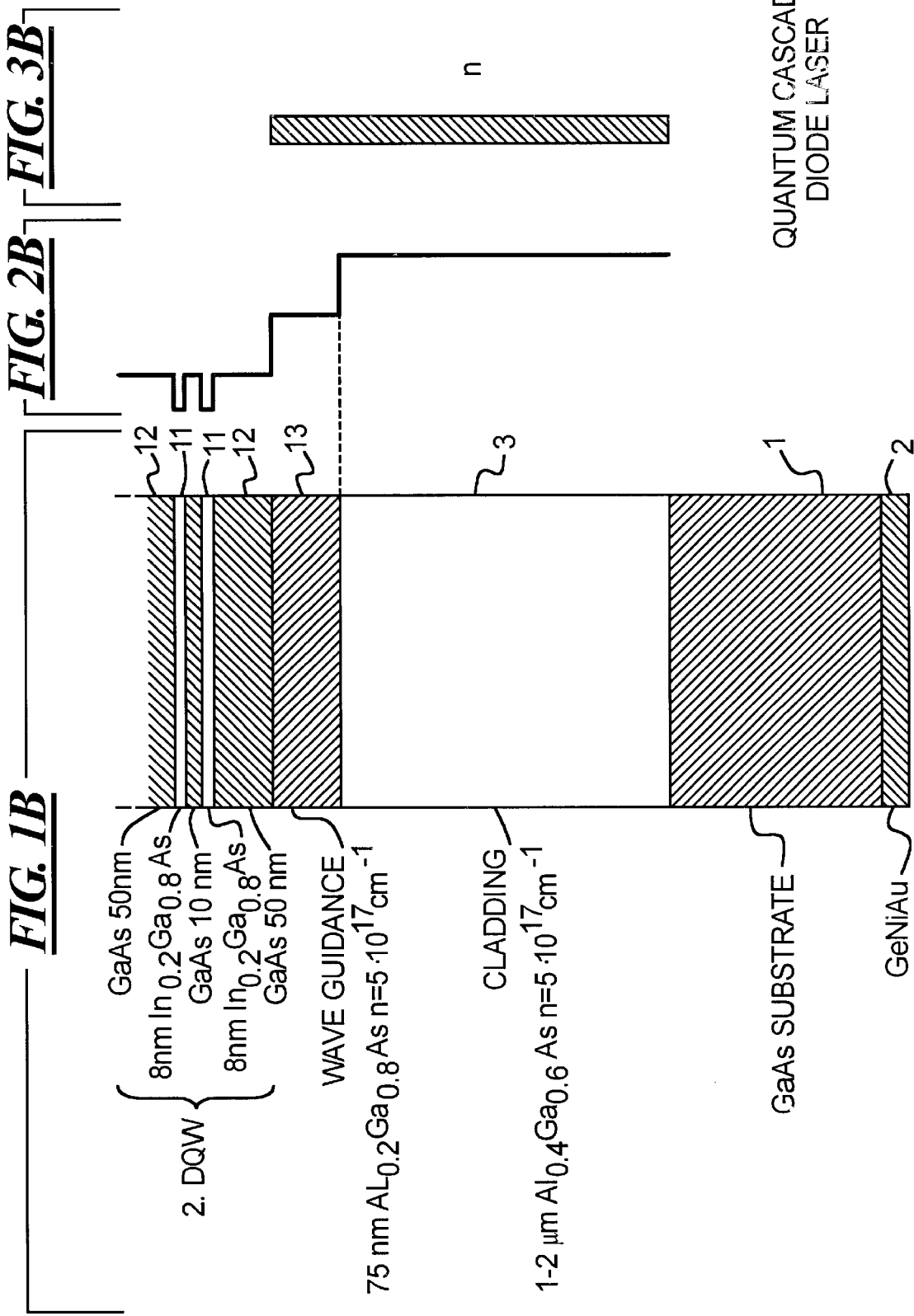

SEMICONDUCTOR LASER CHIP

BACKGROUND OF THE INVENTION

1. Field of the Invention

The present invention is directed to a semiconductor laser chip, whereby a laser-active semiconductor structure is arranged in an optical resonator.

2. Description of the Relate Art

Such laser chips are disclosed, for example, by the publications U.S. Pat. No. 5,016,252, Japanese Published Application 2-71574 and Japanese Published Application 61-247084. These disclose laser diode chips wherein an n-conductive cover layer, an active layer and a p-conductive cover layer are successively applied on a semiconductor substrate.

Semiconductor laser chips of this type are made of the material systems InAlGaAs or InAlGaP on a GaAs substrate, InAlGaAsP on an InP substrate or InAlGaN on a sapphire or SiC substrate as edge which are referred to as vertical cavity surface emitting lasers (VCSEL).

SUMMARY OF THE INVENTION

An object of the present invention is to provide a semiconductor laser chip that exhibits enhanced efficiency and an enhanced output power compared to the Prior Art.

This object and others are achieved by semiconductor laser chips having a laser-active semiconductor structure is arranged in an optical resonator, two or more series-connected, laser-active pn-junctions whose forward directions are isodirected introduced into the same resonator of the semiconductor laser chip, the laser-active pn-junctions contain quantum wells for the charge carrier recombination, a pn-junction whose forward direction is directed opposite the forward direction of the laser-active pn-junctions is respectively arranged between two laser-active pn-junctions, this reverse-poled pn-junction is located in semiconductor material having a larger band gap than that of the semiconductor material of the laser-active pn-junctions, and the laser-active pn-junctions are located in a wave-guiding zone.

In another embodiment, the emitting semiconductor laser chip has a laser-active semiconductor structure arranged in an optical resonator, two or more series-connected, laser-active pn-junctions whose forward directions are isodirected are introduced into one and the same resonator of the semiconductor laser chip, the laser-active pn-junctions contain quantum wells for the charge carrier recombination, a pn-junction whose forward direction is directed opposite the forward direction of the laser-active pn-junctions is respectively arranged between two laser-active pn-junctions, this reverse-poled pn-junction is located in semiconductor material having a larger band gap than that of the semiconductor material of the laser-active pn-junctions, and the quantum wells of the laser-active pn-junctions are located in the bellies and the reverse-poled pn-junction is located in the node or, respectively, in the nodes of the standing wave field generated in the semiconductor chip.

According to the invention two or more series-connected, laser-active pn-junctions are introduced into the same resonator of the semiconductor laser chip, the forward directions of the pn-junctions being isodirected. The laser-active pn-junctions contain quantum wells for the charge carrier recombination. A pn-junction whose forward direction is opposite to the forward direction of the laser-active pn-junctions, that is thus reverse-poled compared to the forward direction of the semiconductor laser chip, is arranged between the pn-junctions. The reverse-poled pn-junction or junctions are located in a semiconductor material having a greater band gap than the semiconductor material of the laser-active pn-junctions.

Given an edge-emitting semiconductor laser chip, the laser-active pn-junctions are located in a wave-guiding zone. Given vertically emitting semiconductor laser chips (VCSELs), the quantum wells of the laser-active pn-junctions lie in the bellies and the reverse-poled pn-junction or, respectively, the reverse-poled pn-junctions lie in the node or nodes of the standing wave field generated in the semiconductor laser chip.

Advantageously, the spacing between two successive laser-active pn-junctions amounts to less than 2 $\mu$m.

BRIEF DESCRIPTION OF THE DRAWINGS

The quantum wells are undoped in a preferred embodiment.

The invention is explained in greater detail below on the basis of two exemplary embodiments in conjunction with the Figures FIG. 1A is a side cross-section of a top portion and FIG. 1B is a side cross-section of a bottom portion of a laser diode according to the present invention;

FIGS. 2A and 2B are top and bottom portions of potential levels adjacent corresponding to the laser diode structure;

FIGS. 3A and 3B are top and bottom portions of doping level diagrams corresponding to the diode structure.

DETAILED DESCRIPTION OF PREFERRED EMBODIMENTS

Figure 4A:
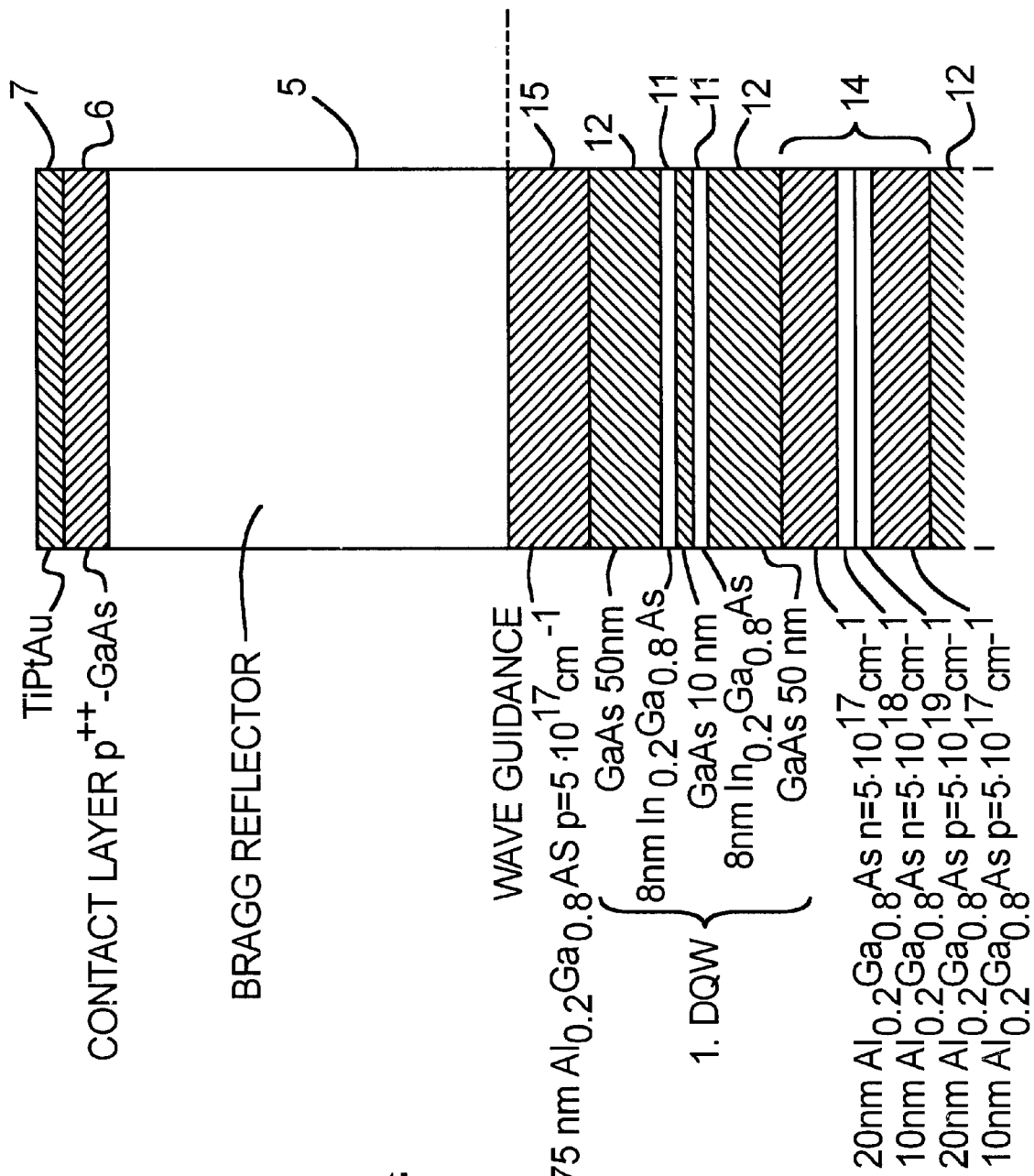
FIGS. 4A and 4B are top and bottom portions of a cross section of a second embodiment of a laser diode of the present invention.

The structure of an edge-emitting multiple pn laser diode shown in the FIGS. 1A and 1B comprises a substrate 1 that, for example, is composed of n-doped GaAs. An electrical contact 2, for example an n-contact that is fabricated, for example, of GeNiAu, is applied onto a first principal surface of this substrate 1. A first cladding layer 3 that, for example, is composed of AlGaAs, particularly of $Al_{0.4}Ga_{0.6}As$, comprises a doping of $n \cong 5*10^{17}$ $cm^{31}$ and a thickness of 1–2 $\mu$m is arranged on a second principal surface of the substrate 1 lying opposite the first principal surface.

An active layer sequence 4 is arranged on the first cladding layer 3, the sequence 4 containing two groups of preferably undoped quantum wells—specifically respectively two quantum wells 11 here—and being enclosed by barrier layers 12 and capture layers 13–15. The quantum wells as are shown by the potential diagrams 2A and 2B, are composed, for example, of undoped InGaAs (for example, $In_{0.2}Ga_{0.8}As$ quantum wells); the barrier layers 12 and capture layers 13–15 are composed, for example, of GaAs or, respectively, $Al_{0.2}Ga_{0.8}As$.

The quantum wells 11 respectively lie in the depletion zones of pn diodes operated in a forward direction respectively composed of two quantum wells 11, two barrier layers 12, an n-conductive and a p-conductive capture layer. The capture layer 14 arranged between the two groups of quantum wells 11 is fashioned as a highly doped diode (for example, $n \cong 5*10^{18}$ $cm^{-3}$ and $p \cong 5*10^{19}$ $cm^{-3}$) which is reverse-poled relative to the laser-active pn-junctions 8 and 9 and exhibits a greater band gap than the laser-active pn-junctions. The doping levels are indicated by the doping diagrams FIGS. 3A and 3B.

A second cladding layer 5 is applied on the active layer sequence 4, the second cladding layer 5 being composed, for example, of AlGaAs, particularly of $Al_{0.4}Ga_{0.6}As$, comprising a doping $p \cong 5*10^{17}$ $cm^{-3}$ and a thickness of 1–2 $\mu$m. A contact layer 6 on which an electrical contact 7, a p-contact here, is applied is located on this cladding layer 5. The contact layer 6 is composed, for example, of $p^{++}$-doped GaAs and is approximately 10 nm thick, and the p-contact 7 is composed, for example, of TiPtAu.

The structure shown in FIGS. 1A and 1B can be directly manufactured as an edge-emitting broad-strip laser. It can also be employed in edge-emitting, transversally single-mode laser diodes that, for example, are to be realized in a ridge waveguide structure.

Figure 4B:
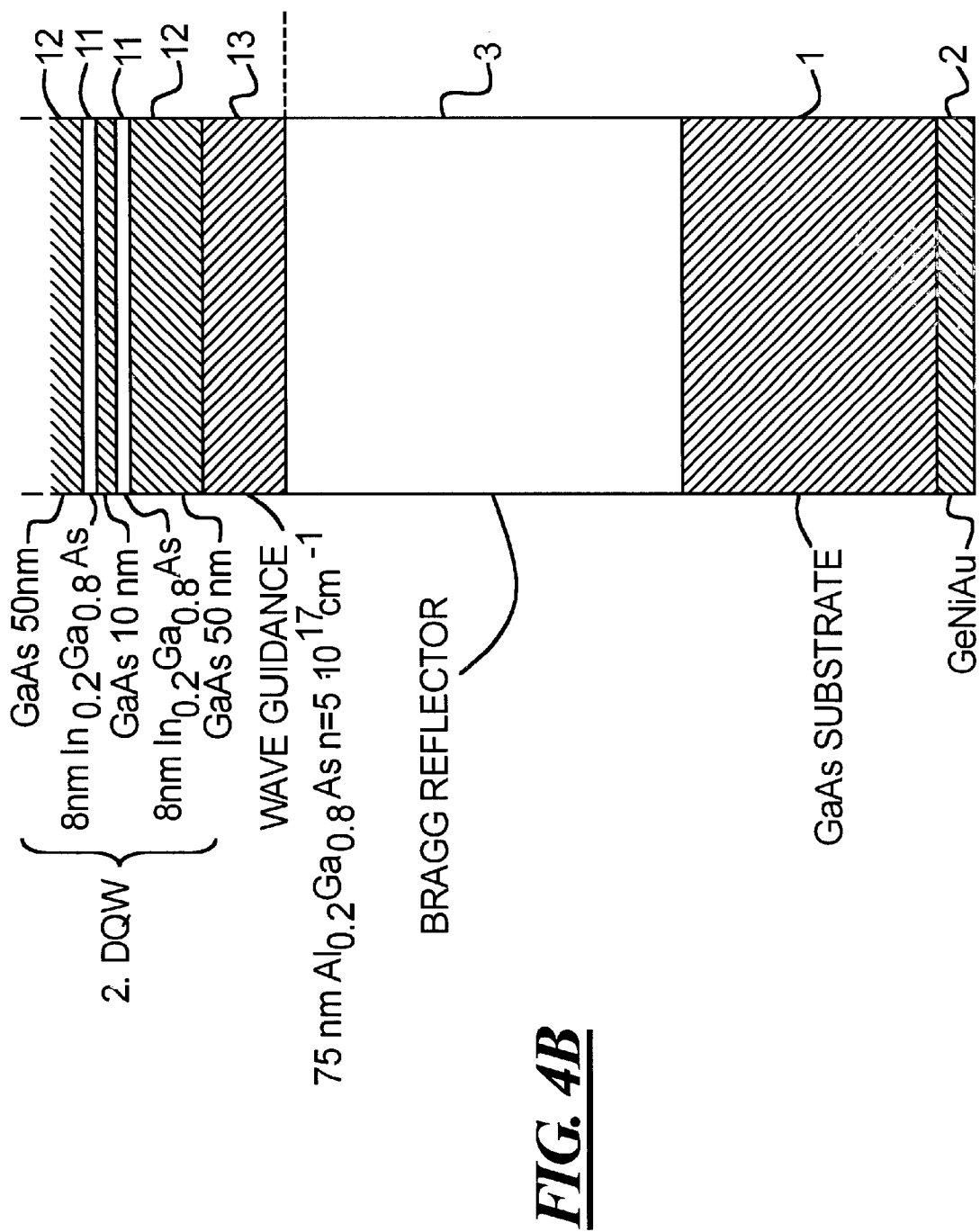

A further exemplary embodiment is a vertically emitting semiconductor laser chip as shown in FIGS. 4A and 4B. Therein, Bragg reflector layers, for example AlAs—GaAs Bragg mirrors, are employed in a known way instead of the two cladding layers 3 and 5 of the exemplary embodiment of FIGS. 1A and 1B. In other words, the cladding layers 3 and 5 are replaced by reflectors, but otherwise the structure is the same.

The manufacture of the above-described layer sequences can, for example, ensue with molecular beam epitaxy. Carbon, for example, can serve for p-doping and silicon can serve for n-doping. The manufacture is also possible with metallo-organic vapor phase epitaxy.

The inventive structure of a semiconductor laser chip leads to an increase in the gain to be achieved in the active layer sequence and, thus, to operation at lower threshold current densities. This enables the design of ultra-efficient large optical cavity structures.

The inventive structure is not limited to the InAlGaAs semiconductor system but can also be realized, for example, in the material systems InAlGaAsP on InP substrate or, too, in the InAlGaNAs system. The laser structure can also be realized in II–VI semiconductor systems such as, for example, ZnMgBeSSe.

Although other modifications and changes may be suggested by those skilled in the art, it is the intention of the inventor to embody within the patent warranted hereon all changes and modifications as reasonably and properly come within the scope of their contribution to the art.

What is claimed is:

1. An edge-emitting semiconductor laser chip, comprising:

an optical resonator;

a laser-active semiconductor structure in said optical resonator;

at least two series-connected laser-active pn-junctions in said optical resonator, said at least two laser-active pn-junctions having forward directions isodirected;

said at least two laser-active pn-junctions contain quantum wells for charge carrier recombination;

a reverse-poled pn-junction having a forward direction directed opposite the forward direction of said at least two laser-active pn-junctions and arranged between said at least two laser-active pn-junctions, said reverse-poled pn-junction being located in semiconductor material having a larger band gap than that of the semiconductor material of said at least two laser-active pn-junctions; and said at least two laser-active pn-junctions being located in a wave-guiding zone.

2. A vertically emitting semiconductor laser chip, comprising:

an optical resonator;

a laser-active semiconductor structure in said optical resonator;

at least two series-connected laser-active pn-junctions in said optical resonator, said at least two laser-active pn-junctions having forward directions which are isodirected;

said at least two laser-active pn-junctions containing quantum wells for charge carrier recombination;

a reverse-poled pn-junction whose forward direction is directed opposite the forward direction of said at least two laser-active pn-junctions and which is arranged between said at least two laser-active pn-junctions;

said reverse-poled pn-junction being located in semiconductor material having a larger band gap than that of the semiconductor material of said at least two laser-active pn-junctions; and the quantum wells of said at least two laser-active pn-junctions being located in bellies and said reverse-poled pn-junction being located in a node of a standing wave field generated in the semiconductor chip.

* * * * *